United States Patent
Galton

(10) Patent No.: US 9,461,657 B2
(45) Date of Patent: Oct. 4, 2016

(54) FOREGROUND AND BACKGROUND BANDWIDTH CALIBRATION TECHNIQUES FOR PHASE-LOCKED LOOPS

(71) Applicant: QUALCOMM Incorporated, San Diego, CA (US)

(72) Inventor: Ian Galton, Del Mar, CA (US)

(73) Assignee: Qualcomm Incorporated, San Diego, CA (US)

( * ) Notice: Subject to any disclaimer, the term of this patent is extended or adjusted under 35 U.S.C. 154(b) by 84 days.

(21) Appl. No.: 14/566,847

(22) Filed: Dec. 11, 2014

(65) Prior Publication Data

US 2016/0065223 A1 Mar. 3, 2016

Related U.S. Application Data

(60) Provisional application No. 62/042,652, filed on Aug. 27, 2014.

(51) Int. Cl.
| | |
|---|---|
| *H03L 7/093* | (2006.01) |
| *H03L 7/197* | (2006.01) |
| *H03L 7/187* | (2006.01) |
| *H03L 7/099* | (2006.01) |

(52) U.S. Cl.
CPC ............ *H03L 7/093* (2013.01); *H03L 7/0991* (2013.01); *H03L 7/187* (2013.01); *H03L 7/197* (2013.01)

(58) Field of Classification Search
CPC ..... H03L 7/093; H03L 7/0991; H03L 7/187; H03L 7/197
See application file for complete search history.

(56) References Cited

U.S. PATENT DOCUMENTS

| | | | | |
|---|---|---|---|---|
| 7,183,860 | B2* | 2/2007 | Staszewski | H03L 7/085 327/159 |
| 7,365,609 | B2* | 4/2008 | Waheed | H03B 5/04 331/17 |
| 7,808,325 | B2* | 10/2010 | Waheed | H03L 7/099 331/1 A |
| 8,000,428 | B2* | 8/2011 | Staszewski | H03L 7/085 375/362 |
| 8,008,956 | B1 | 8/2011 | Shin et al. | |
| 8,019,564 | B2 | 9/2011 | Park | |
| 2009/0256639 | A1* | 10/2009 | Chiu | H03L 1/00 331/16 |
| 2014/0077849 | A1 | 3/2014 | Chen et al. | |
| 2016/0065224 | A1* | 3/2016 | Galton | H03L 7/093 327/157 |

OTHER PUBLICATIONS

Giovannim., et al., "2.9 A Background Calibration Technique to Control Bandwidth in Digital PLLs," IEEE International Solid State Circuits Conference, IEEE Service Center, New York, NY, US, Feb. 9, 2014, pp. 54-55, XP032574986, ISSN: 0193-6530, DOI: 10.1109/ISSCC.2014.6757335 ISBN: 978-1-4799-0918-6 [retrieved on Mar. 5, 2014].
International Search Report and Written Opinion—PCT/US2015/042445—ISA/EPO —Nov. 26, 2015.

(Continued)

*Primary Examiner* — Patrick O'Neill
(74) *Attorney, Agent, or Firm* — Patterson & Sheridan, L.L.P.

(57) ABSTRACT

Certain aspects of the present disclosure support a method and apparatus for foreground and background bandwidth calibration in a frequency-do-digital converter based phase-locked loop (FDC-PLL) device.

10 Claims, 10 Drawing Sheets

(56) References Cited

OTHER PUBLICATIONS

Li J., et al., "An Overall Gain Estimation Algorithm for all Digital Phase Locked Loops", 2014 IEEE International Symposium on Circuits and Systems (ISCAS), IEEE, Jun. 1, 2014, pp. 325-328, XP032624745, DOI: 10.1109/ISCAS.2014.6865131 [retrieved on Jul. 24, 2014].

Venerus C., et al., "Delta-Sigma FDC Based Fractional-N PLLs," IEEE Transactions on Circuits and Systems—I: Regular Papers, XP011505582, May 2013, vol. 60, No. 5, pp. 1274-1285.

* cited by examiner

FOREGROUND AND BACKGROUND BANDWIDTH CALIBRATION TECHNIQUES FOR PHASE-LOCKED LOOPS

CLAIM OF PRIORITY UNDER 35 U.S.C. §119

This application claims benefit of U.S. Provisional Patent Application Ser. No. 62/042,652, filed Aug. 27, 2014 and entitled "Foreground and Background Bandwidth Calibration Techniques for Phase-Locked Loops", incorporated by reference in its entirety.

BACKGROUND

1. Field

Certain aspects of the present disclosure generally relate to electronic circuits and, more particularly, to a method and apparatus for foreground and background bandwidth calibration for a phase-locked loop (PLL) device utilized in various electronic applications and apparatuses.

2. Background

A phase-locked loop (PLL) is an electronic system or a device that generates an output signal whose phase is related to a phase of an input signal. PLL devices are utilized in various electronic applications, including but not limited to computers and communications (e.g., wireless communications). PLLs are used to generate a stable frequency in multiples or in fractional multiples of an input frequency, which can be employed as a clock frequency in digital circuits such as microprocessors.

SUMMARY

Certain aspects of the present disclosure provide a method for performing loop gain calibration in a phase-locked loop (PLL) device for generating a periodic signal. The method generally includes applying, during a first operating mode of the PLL device, a sequence of pulses to a frequency-to-phase accumulator in a digital loop controller interfaced with a digitally-controlled oscillator (DCO) of the PLL device, computing, during the first operating mode of the PLL device, an initial value of a calibration gain adjustment based on output values of a loop filter interfaced with the frequency-to-phase accumulator, and applying, during a second operating mode of the PLL device subsequent to the first operating mode, the initial value of the calibration gain adjustment in the digital loop controller to adjust for DCO gain variations to control the frequency of the periodic signal, until a calibration circuit of the digital loop controller updates the calibration gain adjustment during the second operating mode.

Certain aspects of the present disclosure provide a method for performing loop gain calibration in a phase-locked loop (PLL) device for generating a periodic signal. The method generally includes applying a sequence of pulses to a frequency-to-phase accumulator in a digital loop controller of the PLL device, adjusting values of a digital word related to a frequency of the periodic signal for each pulse in the sequence of pulses, wherein the values of the digital word are affected by each pulse, measuring a plurality of noisy estimates of a calibration gain adjustment based on the values of the digital word being adjusted for the sequence of pulses, averaging the plurality of noisy estimates of the calibration gain adjustment to estimate the calibration gain adjustment, and applying the estimated calibration gain adjustment in the digital loop controller of the PLL device interfaced with a digitally-controlled oscillator (DCO) to adjust for DCO gain variations for controlling the frequency of the periodic signal.

Certain aspects of the present disclosure provide an apparatus for performing loop gain calibration in a phase-locked loop (PLL) device for generating a periodic signal. The apparatus generally includes a first calibration circuit configured to apply, during a first operating mode of the PLL device, a sequence of pulses to a frequency-to-phase accumulator in a digital loop controller interfaced with a digitally-controlled oscillator (DCO) of the PLL device, wherein the first calibration circuit is further configured to compute, during the first operating mode of the PLL device, an initial value of a calibration gain adjustment based on output values of a loop filter interfaced with the frequency-to-phase accumulator, and a second calibration circuit of the digital loop controller configured to apply, during a second operating mode of the PLL device subsequent to the first operating mode, the initial value of the calibration gain adjustment in the digital loop controller to adjust for DCO gain variations to control the frequency of the periodic signal, until the second calibration circuit updates the calibration gain adjustment during the second operating mode.

Certain aspects of the present disclosure provide an apparatus for performing loop gain calibration in a phase-locked loop (PLL) device for generating a periodic signal. The apparatus generally includes a calibration circuit configured to apply a sequence of pulses to a frequency-to-phase accumulator in a digital loop controller of the PLL device, and circuitry of the digital loop controller interfaced with the frequency-to-phase accumulator configured to adjust values of a digital word related to a frequency of the periodic signal for each pulse in the sequence of pulses, wherein the values of the digital word are affected by each pulse, wherein the calibration circuit is also configured to measure a plurality of noisy estimates of a calibration gain adjustment based on the values of the digital word being adjusted for the sequence of pulses, average the plurality of noisy estimates of the calibration gain adjustment to estimate the calibration gain adjustment, and apply the estimated calibration gain adjustment in the digital loop controller of the PLL device interfaced with a digitally-controlled oscillator (DCO) to adjust for DCO gain variations for controlling the frequency of the periodic signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
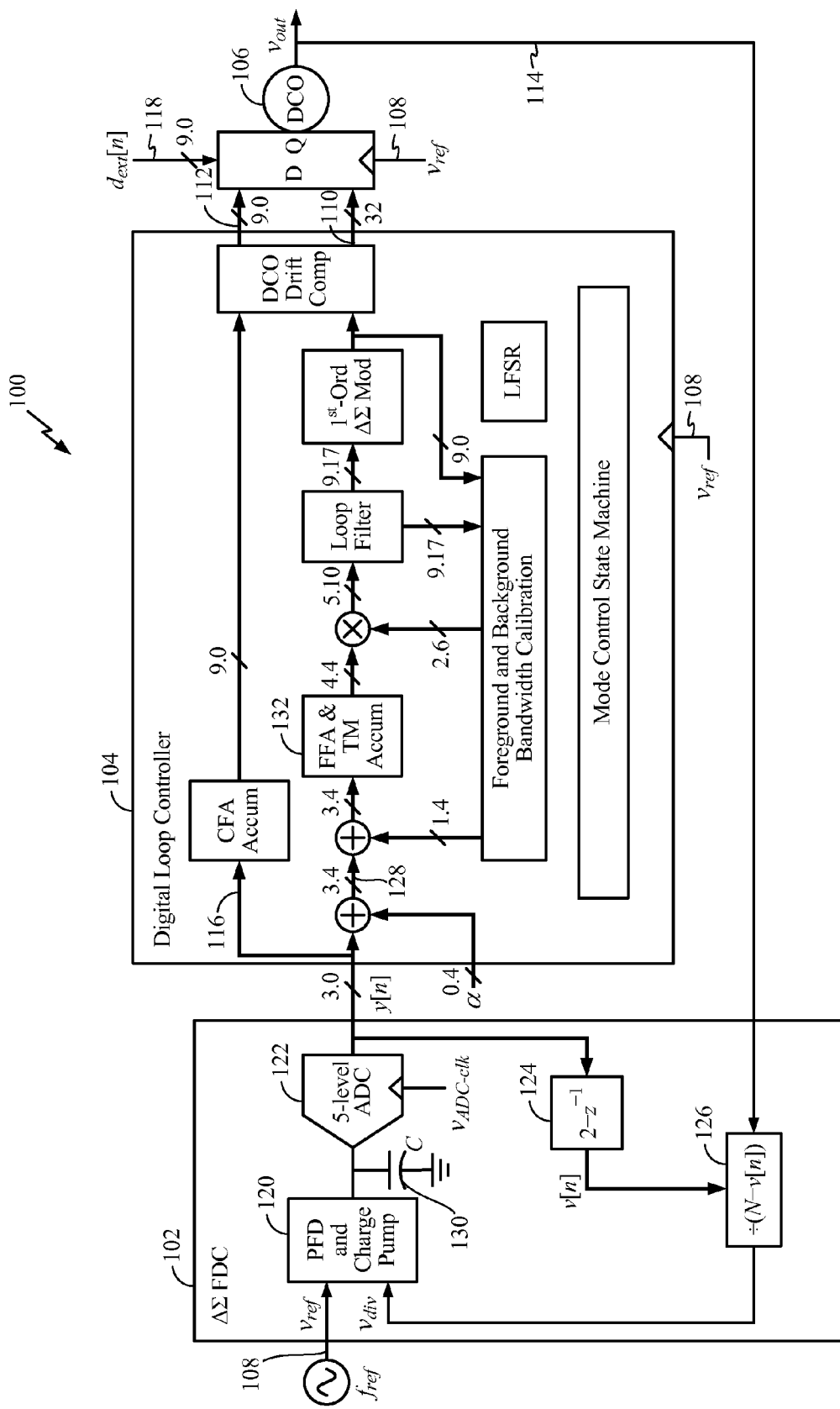
FIG. 1 illustrates an example high-level block diagram of a frequency-to-digital converter based phase-locked loop (FDC-PLL), in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Bandwidth Calibration Techniques

The jitter and settling time of a phase-locked loop (PLL) device for generating a clock frequency for microprocessors may depend on its bandwidth. In the same time, the PLL's bandwidth may depend on the gain of various analog components within the PLL device. Unfortunately, these gains tend to vary widely over process and temperature. Nevertheless, it is highly undesirable to have the PLL's jitter and settling time vary over the process and temperature. Therefore, it is desirable to have a means by which to automatically compensate for analog gain variations such that the intended bandwidth is achieved independently of process and temperature variations.

Aspects of the present disclosure support two related methods for bandwidth calibration that may work together to address the aforementioned problem of varying the jitter and settling time of the PLL device. The presented bandwidth calibration techniques may apply to a frequency-to-digital converter based PLL (FDC-PLL) device. For example, the FDC-PLL may be used as a clock source for the 20 nm microprocessors.

One presented bandwidth calibration method is a foreground bandwidth calibration (FBC) technique, and the other is a background bandwidth calibration (BBC) technique. The purpose of the two techniques is to automatically normalize the FDC-PLL's bandwidth by compensating for loop gain errors introduced by non-ideal analog circuit behavior and process, as well as by temperature variations.

In an aspect of the present disclosure, the FBC technique may operate whenever the FDC-PLL is in the process of acquiring lock after which its operation is suspended. The FBC technique may rapidly estimate and correct the FDC-PLL's loop gain error. On the other hand, this technique may rely on switching the FDC-PLL's frequency to two values, so it may not be suitable for operation once the FDC-PLL enters tracking mode (i.e., once it has finished acquiring lock). Instead, in another aspect of the present disclosure, the BBC technique may operate once the FDC-PLL enters tracking mode to compensate for the relatively slow variability of the loop gain expected over time (e.g., because of temperature changes).

FDC-PLL Operation

FIG. 1 illustrates the example 100 of a high-level block diagram of the FDC-PLL, in which aspects of the present disclosure may be practiced, in accordance with certain aspects of the present disclosure. As illustrated in FIG. 1, the FDC-PLL 100 may comprise three main components: a delta-sigma frequency-to-digital converter (FDC) 102, a digital loop controller 104, and a digitally-controlled oscillator (DCO) 106. In an aspect of the present disclosure, the digital loop controller 104 is an all-digital block clocked on each rising edge of a reference signal 108. The controller 104 may generate a 32-bit fine DCO control sequence 110, $f_{fine}[n]$, and a 9-bit coarse DCO control sequence 112, $f_{coarse}[n]$. The two sequences may be latched into the DCO 106 on each rising edge of the reference signal 108. In an aspect of the present disclosure, the delta-sigma FDC 102 may compare the reference signal 108 to the DCO output signal 114, and may generate a 3-bit output sequence 116.

In accordance with certain aspects of the present disclosure, the FDC-PLL 100 illustrated in FIG. 1 may have four modes of operation: coarse frequency acquisition (CFA) mode, fine frequency acquisition (FFA) mode, tracking mode, and open loop control (OLC) mode. Whenever the FDC-PLL 100 is reset (which should happen whenever it is powered up or the desired frequency is changed), under normal operation it first enters the CFA mode, then the FFA mode, and then the tracking mode. During the CFA mode, $f_{coarse}[n]$ may be adjusted to rapidly slew the DCO frequency to within $f_{ref}$ of the desired output frequency, where $f_{ref}$ is the reference frequency (e.g., $f_{ref}$=19.2 MHz). During the FFA mode, foreground bandwidth calibration may be performed and the fine DCO control sequence $f_{fine}[n]$ may be adjusted to lock the PLL to the desired output frequency, at which point the PLL enters tracking mode.

In an aspect of the present disclosure, the OLC mode may be entered at a request of a user. In this mode, the DCO 106 may be taken out of phase lock and the user can change the frequency of the DCO 106 as desired by changing an external codeword 118, $d_{ext}[n]$. The OLC mode may persist until control of the DCO 106 is relinquished by the user and tracking mode is re-established. In an aspect of the present disclosure, the purpose of the OLC mode is to allow digitally controlled throttling of the output frequency with rapid transition (e.g., less than a microsecond) back to tracking mode.

Digital Data Bus Representation and Notation

Except where stated otherwise, each digital data bus in the FDC-PLL uses two's complement fixed-point arithmetic. For certain aspects of the present disclosure, an m-bit data bus with bit values $b_{m-1}, b_{m-2}, b_{m-3}, \ldots, b_0$ during a given clock period is interpreted as having a numerical value during that clock period given by:

$$2^{-r}\left(-2^{q+r-1}b_{q+r-1} + \sum_{k=0}^{q+r-2} 2^k b_k\right), \quad (1)$$

where q and r are non-negative integers that satisfy m=q+r and denote how many bits make up the integer and fractional parts of the value, respectively.

Data buses shown in Figures in this disclosure are labeled with the corresponding values of q and r separated by a period to specify how the numerical values of the buses are determined in conjunction with equation (1). In each case, the first integer is the value of q and the second integer is the value of r for that data bus. For example, the data bus output 116 by the 5-level analog-to-digital converter (ADC) 122 shown in FIG. 1 is labeled "3.0", which indicates that q=3 and r=0. It follows from equation (1) that the data bus 116 may be capable of representing values in the set {-4, -3, -2, -1, 0, 1, 2, 3}, although in this case the 5-level ADC 122 restricts this range to the five values in the set {-2, -1, 0, 1, 2}.

Some of the Figures in this disclosure also show data buses labeled with sequence names. Each such sequence name denotes the numerical value of the data bus implied by equation (1) as a function of the clock period index. For example, the data bus 116 at the output of the 5-level ADC 122 shown in FIG. 1 is labeled "y[n]", which for each n is interpreted as the value given by equation (1) once the data bus bit values have settled during the nth clock period. For certain aspects of the present disclosure, different components within the FDC-PLL are clocked at different rates, so n refers to the period index of whichever clock is clocking the data bus under consideration.

Some of the adders and accumulators shown in the Figures in this disclosure are labeled with "(clip)". This notation indicates that each time an addition or subtraction results in a value with a magnitude that is too large to represent by the corresponding q.r data bus, the data bus value should be set to its largest-magnitude value with the same sign as the ideal addition or subtraction value. In other words, adders and accumulators labeled with "(clip)" should clip any values that exceed the allowed range of the corresponding data bus. Any adders or accumulators shown in Figures in this disclosure that are not labeled with "(clip)" should be allowed to roll-over via normal two's complement arithmetic.

Delta-Sigma FDC

In accordance with certain aspects of the present disclosure, the delta-sigma FDC 102 may be used in all modes except for the OLC mode. As illustrated in FIG. 1, the FDC 102 may comprise a phase-frequency detector (PFD) 120, a charge pump (illustrated in FIG. 1 as a part of the PFD 120), the 5-level ADC 122, $2-z^{-1}$ block 124, and a multi-modulus divider 126. In an aspect of the present disclosure, the FDC output 116, y[n], is a 5-level digital sequence with a sample-rate equal to the reference frequency, $f_{ref}$.

In accordance with certain aspects of the present disclosure, the FDC output y[n] may be represented as a sum of two terms. One of the terms may be proportional to $Nf_{ref}$ minus the average frequency of the DCO 106 over the reference period, where N is the integer portion of the frequency control word chosen by the user. The other term represents second-order high-pass shaped quantization noise identical to that of a second-order delta-sigma modulator with a noise transfer function of $(1-z^{-1})^2$. Therefore, the delta-sigma FDC 102 may effectively measure the average frequency of the DCO 106 each reference period and introduce a second-order high-pass spectrally shaped quantization noise.

During the FFA mode and the tracking mode, the digital loop controller 104 may perform low-pass filtering of the quantization noise and adjust the DCO frequency so as to null a codeword 128, y[n]+α. This may force the average DCO frequency to $(N+α)·f_{ref}$, where α is the fractional portion of the frequency control word chosen by the user with a value between -½ and ½.

In an aspect of the present disclosure, the 5-level ADC 122 may be a flash ADC consisting of four comparators that compare the voltage across a capacitor 130 to four reference voltages with a nominal adjacent spacing of Δ volts. The ADC 122 may sample its input each reference period after the charge pump current sources are turned off and have settled to zero, but well before the next reference period. In an aspect of the present disclosure, the $2-z^{-1}$ block 124 calculates each reference period:

$$v[n]=2y[n]-y[n-1], \quad (2)$$

as soon as y[n] is available and updates the divider modulus 126 such that the next divider edge occurs N-v[n] DCO periods from the time of the most recent divider edge.

Tracking Mode

Figure 2:
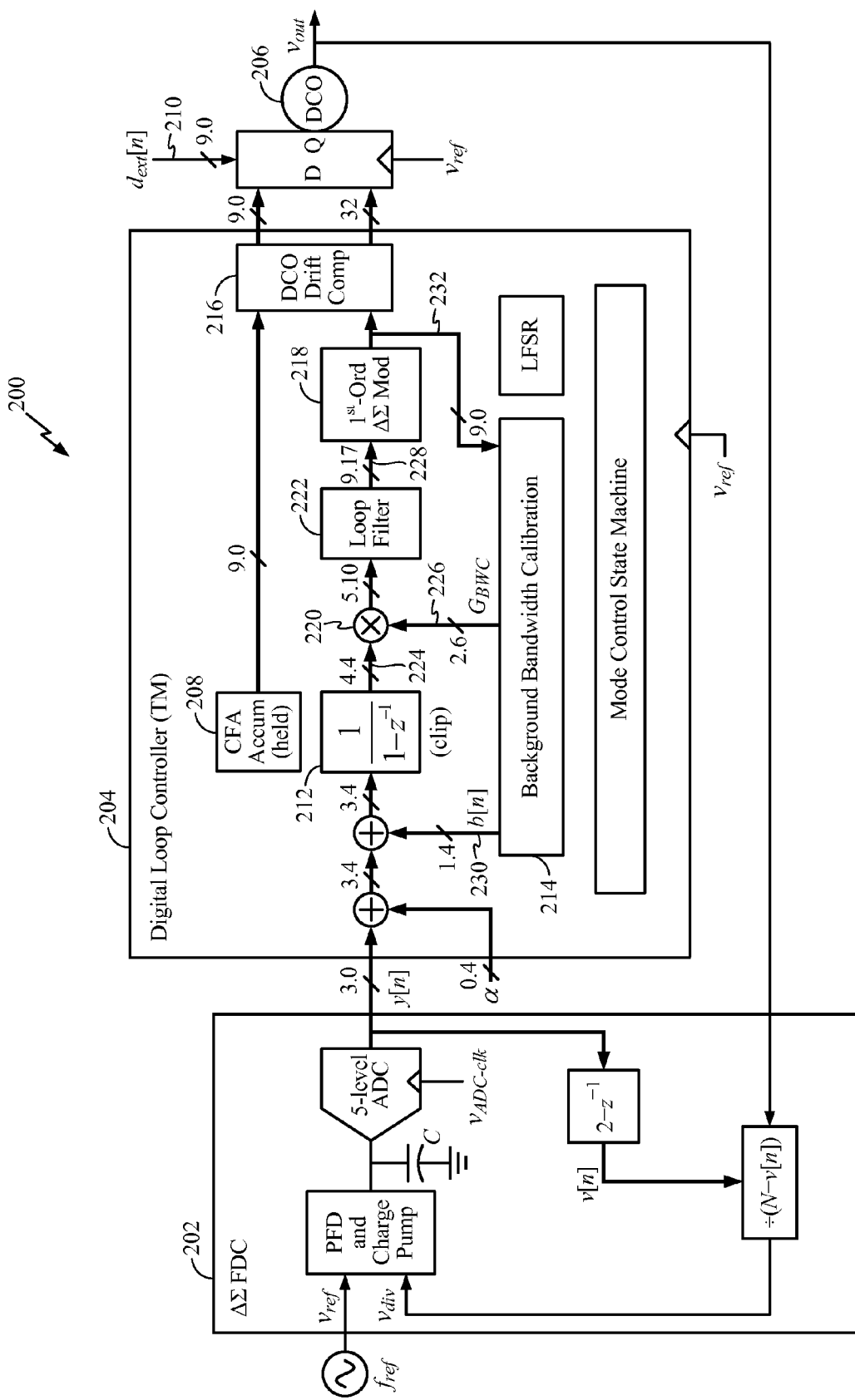
FIG. 2 illustrates an example block diagram of the FDC-PLL during tracking mode, in accordance with certain aspects of the present disclosure.

FIG. 2 illustrates an example 200 of a high-level architecture of FDC-PLL during tracking mode, in accordance with certain aspects of the present disclosure. In this mode, the FDC-PLL comprises the delta-sigma FDC 202, the digital loop controller block 204 configured for tracking mode, and the DCO 206. It should be noted that the Coarse Frequency Acquisition (CFA) accumulator 208 is not clocked during tracking mode, and it is held at the value it had when tracking mode was entered. Furthermore, the value of codeword 210, $d_{ext}[n]$, may not be changed during tracking mode. In an aspect of the present disclosure, the accumulation block 212 labeled $1/(1-z^{-1})$ in FIG. 2 is the same as the block 132 labeled in FIG. 1 as "FFA & TM Accum" (i.e., Fine Frequency Acquisition and Tracking Mode Accumulator).

During tracking mode, the FDC-PLL 200 may incorporate four tracking loops: the delta-sigma FDC, the DCO control loop, the DCO drift compensator, and the background bandwidth calibration loop (i.e., performed by background bandwidth calibration block 214). The delta-sigma FDC and the DCO control loop may together implement the phase-locking functionality of the FDC-PLL 200. In accordance with certain aspects of the present disclosure, the DCO drift compensator 216 may adjust for DCO center frequency drift, and the background bandwidth calibration loop may adaptively adjust the open-loop gain of the DCO control loop to compensate for loop gain variations (which arise primarily from DCO gain variability).

As illustrated in FIG. 2, the FDC-PLL 200 may also comprise a first-order digital delta-sigma modulator 218 that quantizes the input control word to the DCO 206. In an aspect of the present disclosure, the purpose of modulator 218 is to simplify the DCO design. Although the modulator 218 may add quantization noise with comparable power to that introduced by the delta-sigma FDC 202, the noise is within the target specifications of the FDC-PLL representing an acceptable tradeoff.

DCO Control Loop

In accordance with certain aspects of the present disclosure, the DCO control loop may comprise the delta-sigma FDC 202, accumulator 212, multiplier 220, loop filter 222, first-order digital delta-sigma modulator 218, DCO drift compensator 216, and DCO 206, as illustrated in FIG. 2. The fractional part of the frequency control word, a, may be added to the (integer-valued) output of the 5-level ADC, y[n]. In an aspect of the present disclosure, a is a 4-bit fractional number so it is restricted to the values $\{-8/16, -7/16, -6/16, \ldots, 7/16\}$.

The input to the FFA and TM accumulator 212, $y[n]+\alpha$, is a measure of the difference between the average frequency of the DCO during the nth reference period and the ideal frequency of $(N+\alpha)f_{ref}$. Therefore, it can be viewed as a measure of the PLL's frequency error over the reference period. The accumulator 212 may convert it to a measure of the PLL's phase error over the reference period relative to an arbitrary initial phase that depends on the startup conditions of the PLL.

The output 224 of the accumulator 212 may be multiplied by a scale factor 226, $G_{BWC}$, between 0 and 2 that is provided by the background bandwidth calibration block 214 to regulate the open-loop gain of the DCO control loop as described below. In an aspect of the present disclosure, the background bandwidth calibration block 214 may change $G_{BWC}$ very slowly, so $G_{BWC}$ can be viewed as a constant with respect to evaluating the phase noise and jitter performance of the PLL.

Figure 3:
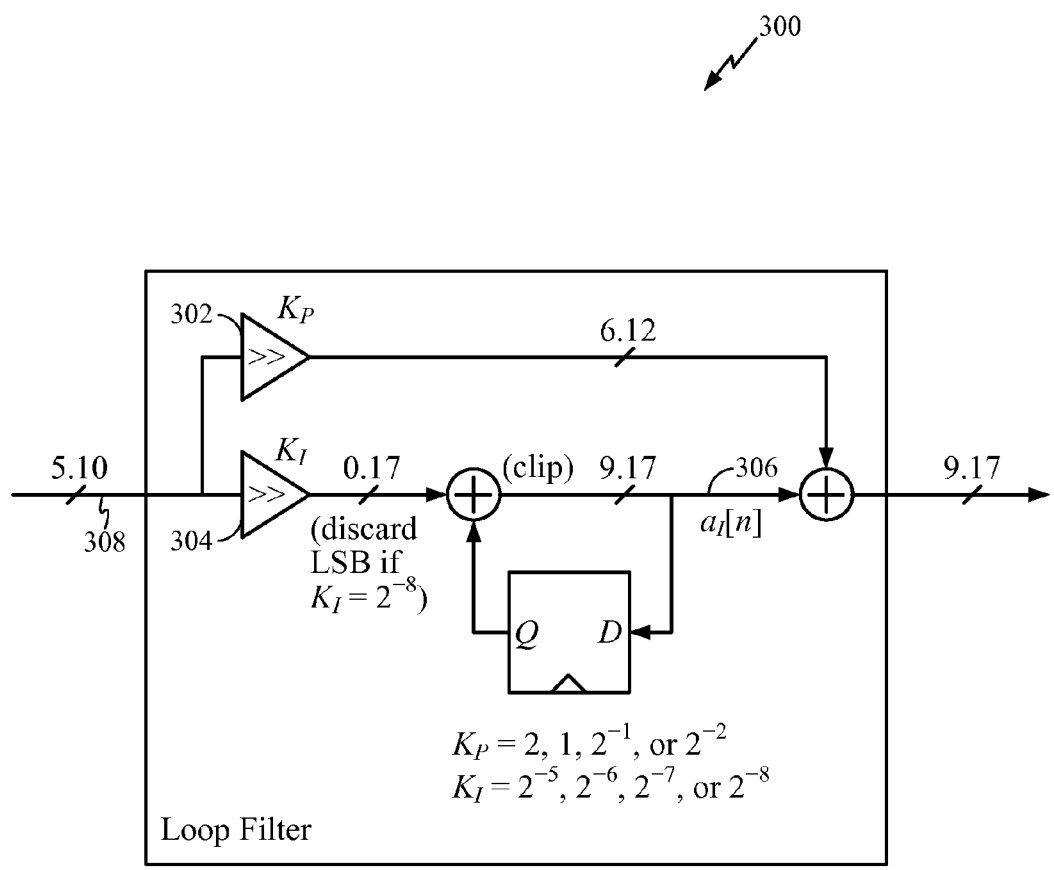
FIG. 3 illustrates an example block diagram of a loop filter within a digital loop controller of the FDC-PLL, in accordance with certain aspects of the present disclosure.

In an aspect of the present disclosure, the loop filter 222 may be a proportional-integral loop filter, a block diagram of which is illustrated in an example block diagram 300 in FIG. 3. Its transfer function may be given as $$L(z) = K_P + K_I \frac{1}{1-z^{-1}}, \quad (3)$$

where $K_P$ and $K_I$ are constants called the proportional path gain and integral path gain, respectively. To avoid arithmetic multipliers $K_p$ and $K_i$ are restricted to powers of two as illustrated by arithmetic shifters 302 and 304 in FIG. 3. When the FDC-PLL is locked, the output of the accumulator 306, $a_I[n]$, may set the DCO frequency (the input 308 to the loop-filter 300 has zero mean when the FDC-PLL is locked).

Referring back to FIG. 2, in an aspect of the present disclosure, the first-order digital delta-sigma modulator 218 may quantize the output 228 of the loop filter 222 (the loop filter 300 from FIG. 3) to an integer-valued sequence. The modulator 218 may introduce first-order shaped noise from quantization and dither, but its gain is unity and it does not introduce a delay. Hence, its effect can be modeled in the DCO control loop as an additive source of uncorrelated first-order shaped noise.

In an aspect of the present disclosure, the DCO drift compensator 216 has a gain of unity and does not introduce a delay. Therefore, like the first-order digital delta-sigma modulator 218, it has no effect on the dynamics of the DCO control loop.

Background Bandwidth Calibration Technique

For certain aspects of the present disclosure, the FDC-PLL's bandwidth may depend strongly on the DCO gain, i.e., on the amount by which the DCO frequency changes when the output of the digital loop controller block changes by one Least Significant Bit (LSB), and the DCO gain can vary significantly with Process-Voltage-Temperature (PVT) variations. The objective of the background bandwidth calibration loop is to continually measure the deviation of the DCO gain from its ideal value during normal tracking mode operation of the PLL and adjust the open loop gain of the PLL to compensate for the deviation. None of the other variables that affect the FDC-PLL's bandwidth are expected to be sensitive to PVT variations, so compensating for DCO gain variations in this manner is expected to ensure a constant, known PLL's bandwidth while the PLL is in operation.

In the following, the signal processing concepts that underlie the background bandwidth calibration loop are described followed by a description of the background bandwidth calibration block implementation.

Underlying Signal Processing Concepts

The objective of the background bandwidth calibration algorithm is to measure $$G_{BWC} = \frac{K_{DCO\text{-}ideal}}{K_{DCO}} \quad (4)$$

during tracking mode, where $K_{DCO\text{-}ideal}$ is the ideal value of the DCO gain $K_{DCO}$ targeted by the design. In an aspect of the present disclosure, in the FDC-PLL $$K_{DCO\text{-}ideal} = 2^{-4} \frac{1}{T_{ref}} = 1.2 \text{ MHz}, \quad (5)$$

so $$G_{BWC} = \frac{2^{-4}}{T_{ref} K_{DCO}}. \quad (6)$$

For certain aspects of the present disclosure, the background bandwidth calibration algorithm is based on a feature of the FDC-PLL that allows precise digital control of the PLL's output phase. Adding a one-sample digital pulse of amplitude $\beta_{cal}$ to the input of the frequency-to-phase accumulator causes the FDC-PLL to adjust a DCO's fine frequency control word $d_{fine}[n]$ 232 from FIG. 2 such that after an initial settling transient the FDC-PLL's output phase at each future point in time deviates by precisely $2\pi\beta_{cal}$ radians from what it would have been had the pulse had not been added.

Let $b_d[n]$ be a doublet sequence defined as $$b_d[n] = \begin{cases} \beta_{cal}, & \text{if } n = 0 \\ -\beta_{cal}, & \text{if } n = M , \\ 0, & \text{otherwise} \end{cases} \quad (7)$$

where M is a large enough integer that the settling transient mentioned above is negligible after M reference periods.

It follows that the phase deviation of the PLL's output signal caused by adding a doublet sequence at the start of reference period $n_0$, i.e., adding the sequence $b_d[n-n_0]$, is $2\pi\beta_{cal}$ radians by the start of reference period $n_0+M$ and 0 by the start of reference period $n_0+2M$. In other words, adding the doublet sequence adjusts the PLL's output phase by $2\pi\beta_{cal}$ radians and then by $-2\pi\beta_{cal}$ radians.

In an aspect of the present disclosure, the FDC-PLL may induce these phase changes by adjusting $d_{fine}[n]$. Adding $b_d[n-n_0]$ as described above may result in $$2\beta_{cal} = T_{ref} K_{DCO} \left( \sum_{n=n_0}^{n_0+M-1} d_{fine}[n] - \sum_{n=n_0+M}^{n_0+2M-1} d_{fine}[n] \right) + e[n], \quad (8)$$

where $e[n]$ is error resulting from the combined effect of all the noise sources in the FDC-PLL. Combining equation (6) and equation (8) gives $$G_{BWC} - \frac{e[n]}{2^5 \beta_{cal}} = \frac{\sum_{n=n_0}^{n_0+M-1} (d_{fine}[n] - d_{fine}[n+M])}{2^5 \beta_{cal}}. \quad (9)$$

Therefore, adding the doublet sequence $b_d[n-n_0]$ to the input of the frequency-to-phase accumulator and calculating the right side of equation (9) from the 2M subsequent values of $d_{fine}[n]$ may result in a measurement of $G_{BWC}$ corrupted by noise.

To a high degree of accuracy, $e[n]$ has zero mean so $G_{BWC}$ can be estimated with high precision by averaging multiple such noisy estimates of $G_{BWC}$. Referring back to FIG. 2, the process of background bandwidth calibration involves adding a calibration sequence 230, b[n], to the input of the frequency-to-phase accumulator 212 that consists of multiple concatenated doublet sequences, measuring $G_{BWC}$ corrupted by noise for each doublet as described above, and averaging the measured values to obtain a precise estimate of $G_{BWC}$.

Although the algorithm would work if b[n] were to consist of $b_d[n]$ followed by $b_d[n-2M]$ followed by $b_d[n-4M]$ and so on, such a b[n] sequence would be periodic which would cause the PLL's phase noise to contain spurious tones. The proposed algorithm avoids this problem by constructing b[n] as $b_d[n]$ or $-b_d[n]$ followed by $b_d[n-2M]$ or $-b_d[n-2M]$ followed by $b_d[n-4M]$ or $-b_d[n-4M]$ and so on, where the sign of each concatenated doublet is chosen randomly. Thus, b[n] can be written as $$b[n] = d_1 \left[ \left\lfloor \frac{n}{2M} \right\rfloor \right] b_d \left[ n - 2M \left\lfloor \frac{n}{2M} \right\rfloor \right], \quad (10)$$

where $\lfloor u \rfloor$ denotes the largest integer less than or equal to u, and $d_1[n]$ is a white random sequence that takes on values of 1 and −1 with equal probability.

Let $P_{BBC}$ be the number of noisy estimates of $G_{BWC}$ to be averaged by the background bandwidth calibration block for each precise estimate of $G_{BWC}$. Then it follows from equations (9)-(10) and the above explanation that the background bandwidth calibration block can estimate a new value of $G_{BWC}$ every $2MP_{BBC}$ reference periods as $$G_{BWC}[m] = \quad (11)$$

$$\frac{1}{P_{BBC} 2^5 \beta_{cal}} \sum_{k=mP_{BBC}}^{(m+1)P_{BBC}-1} d_1[k] \sum_{n=2kM}^{2kM+M-1} (d_{fine}[n] - d_{fine}[n+M]).$$

Two factors may determine the accuracy of the estimate given by equation (11). One factor is the number of averages, $P_{RBC}$. Generally, a larger value of $P_{BBC}$ results in greater accuracy. The other factor is that non-ideal analog components in the delta-sigma FDC can cause $e[n]$ to have a small DC offset that introduces an unwanted bias in equation (11). The error term in equation (9) that contains $e[n]$ is inversely proportional to $\beta_{cal}$, so this problem can be made arbitrarily small by increasing $\beta_{cal}$. However, increasing $\beta_{cal}$ may increase the FDC-PLL's absolute jitter, so this represents a system tradeoff.

The above explanation implies that adding b[n] causes the magnitude of the output phase of the PLL at any given point in time to deviate by at most $2\pi\beta_{cal}$ radians from what it would have been had b[n] not been added. This increases the magnitude of the FDC-PLL's absolute jitter at any given clock edge by a maximum of $\beta_{cal}T_{ref}/(N+\alpha)$ seconds. Hence, adding b[n] increases the one-sigma RMS absolute jitter much more significantly than the six-sigma RMS absolute jitter. The phase changes occur relatively slowly (e.g., over hundreds of reference periods), so their effect on the period jitter of the FDC-PLL is negligible.

Implementation Details

Figure 4:
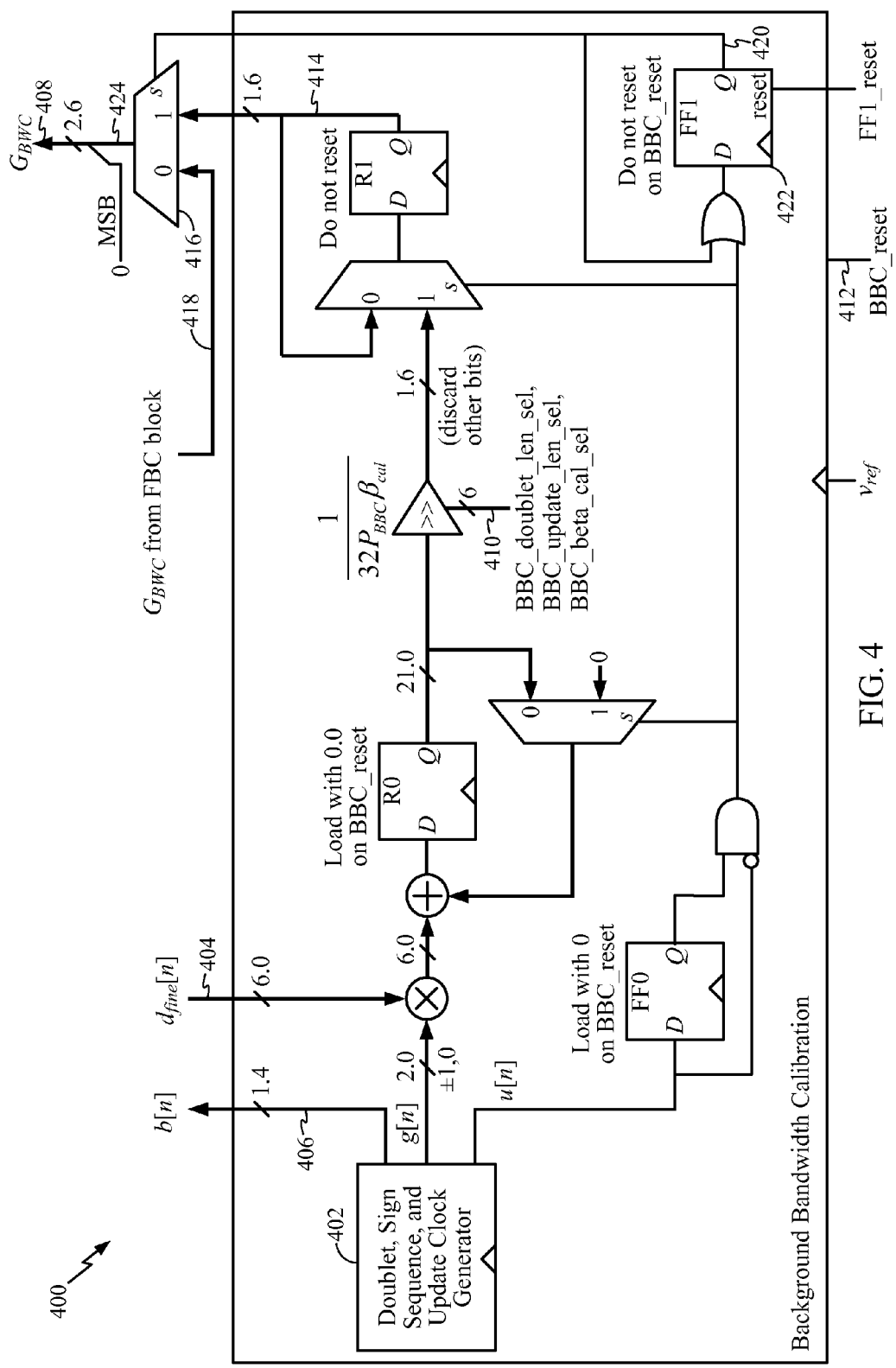
FIG. 4 illustrates an example block diagram of a background bandwidth calibration block of the FDC-PLL, in accordance with certain aspects of the present disclosure.

The register transfer level details of the background bandwidth calibration block 214 from FIG. 2 are illustrated in an example block diagram 400 in FIG. 4. The register transfer level details of the doublet, sign sequence, and update clock generator block 402 within the background bandwidth calibration block 400 are shown in an example block diagram 500 in FIG. 5. As illustrated in the example block diagram 400 in FIG. 4, the system may operate on an input 404, $d_{fine}[n]$ (referring back to FIG. 2, the 9-bit fine frequency codeword output 232 of the first-order digital delta-sigma modulator 218) and generates a doublet sequence 406, b[n] as given by equation (10) and a scalar value 408, $G_{BWC}$ (referring back to FIG. 4, the scalar value 226 input into the multiplier 220) as given by equation (11).

In an aspect of the present disclosure, the values of 2M, $2MP_{BBC}$, and $\beta_{cal}$ defined above may be set by input register values 410 BBC_doublet_len_sel, BCC_update_len_sel, and BBC_beta_cal_sel, respectively. In an aspect, each register value may be set by a user. The register value BBC_doublet_len_sel may set the length of each doublet in reference periods, i.e., the value 2M, to $2^8$, $2^9$, $2^{10}$, or $2^{11}$. The register value BCC_update_len_sel may set the number of reference periods between updates of $G_{BWC}$, i.e., the value $2MP_{BBC}$, to $2^{20}$, $2^{21}$, $2^{22}$, or $2^{23}$. The register value BBC_beta_cal_sel may set $\beta_{cal}$ to $2^{-4}$, $2^{-3}$, $2^{-2}$, or $2^{-1}$.

Figure 5:
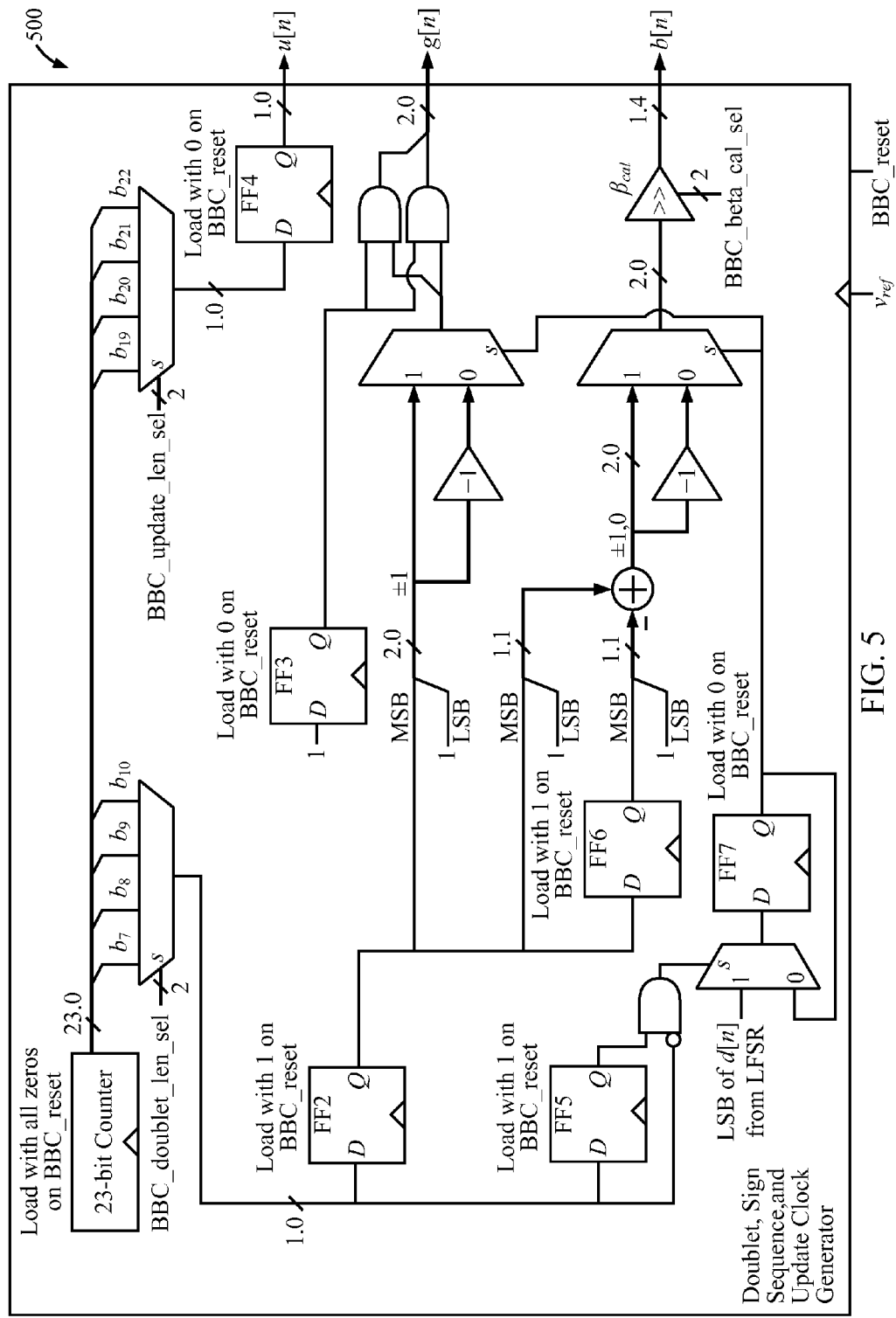
FIG. 5 illustrates an example block diagram of a doublet, sign sequence and update clock generator of the background bandwidth calibration block from FIG. 4, in accordance with certain aspects of the present disclosure.

Whenever the FDC-PLL is not in tracking mode, bit 412, BBC_reset should be set high. This ensures that b[n]=0, g[n]=0, and the output 414 corresponding to $G_{BWC}$ is held. Both BBC_reset and FF1_reset should be set high when the FDC-PLL is reset. When BBC_reset goes high, the system is initialized as indicated in FIGS. 4-5 so that it will begin a new measurement of $G_{BWC}$ one reference clock period after BBC_reset goes low. Therefore, BBC_reset should go low when tracking mode begins.

As indicated in FIG. 4, the value 408 of $G_{BWC}$ used by the FDC-PLL may be provided through a multiplexer 416. Before the BBC block 400 completes its first estimate of $G_{BWC}$ (i.e., prior to $2MP_{BBC}+1$ reference periods after BBC_reset goes low), the FDC-PLL uses the value 418 of $G_{BWC}$ from the foreground bandwidth calibration (FBC) block. Once the BBC block completes its first estimate of $G_{BWC}$, the output 420 of the flip-flop 422 goes high, which causes the BBC block's estimate 414 of $G_{BWC}$ to be used by the FDC-PLL.

In accordance with certain aspects of the present disclosure, it is never legitimate for $G_{BWC}$ to be negative, so the values 414 and 418 of $G_{BWC}$ at the input of the multiplexer 416 shown in FIG. 4 are considered to be unsigned numbers. In an aspect of the present disclosure, a Most Significant Bit (MSB) of 0 may be appended after the multiplexer 416 to convert the multiplexer's output value 424 into a two's complement positive number. In another aspect of the present disclosure, if the $G_{BWC}$ multiplier 220 in FIG. 2 is configured to accept an unsigned value of $G_{BWC}$, it is not necessary to append the MSB to the value 424.

Foreground Bandwidth Calibration Technique

In an aspect of the present disclosure, the foreground bandwidth calibration (FBC) technique may be applied during fine frequency acquisition (FFA) mode of the FDC-PLL. Its purpose is to determine the initial value of $G_{BWC}$ used by the FDC-PLL in tracking mode until the first time the background bandwidth calibration block updates the value. For example, in an aspect, the update-rate of the background bandwidth calibration block may be on the order of 10 Hz, so it may be desirable for the foreground bandwidth calibration technique to avoid having an unpredictable loop bandwidth during the first 100 milliseconds after power-up of the FDC-PLL.

Figure 6:
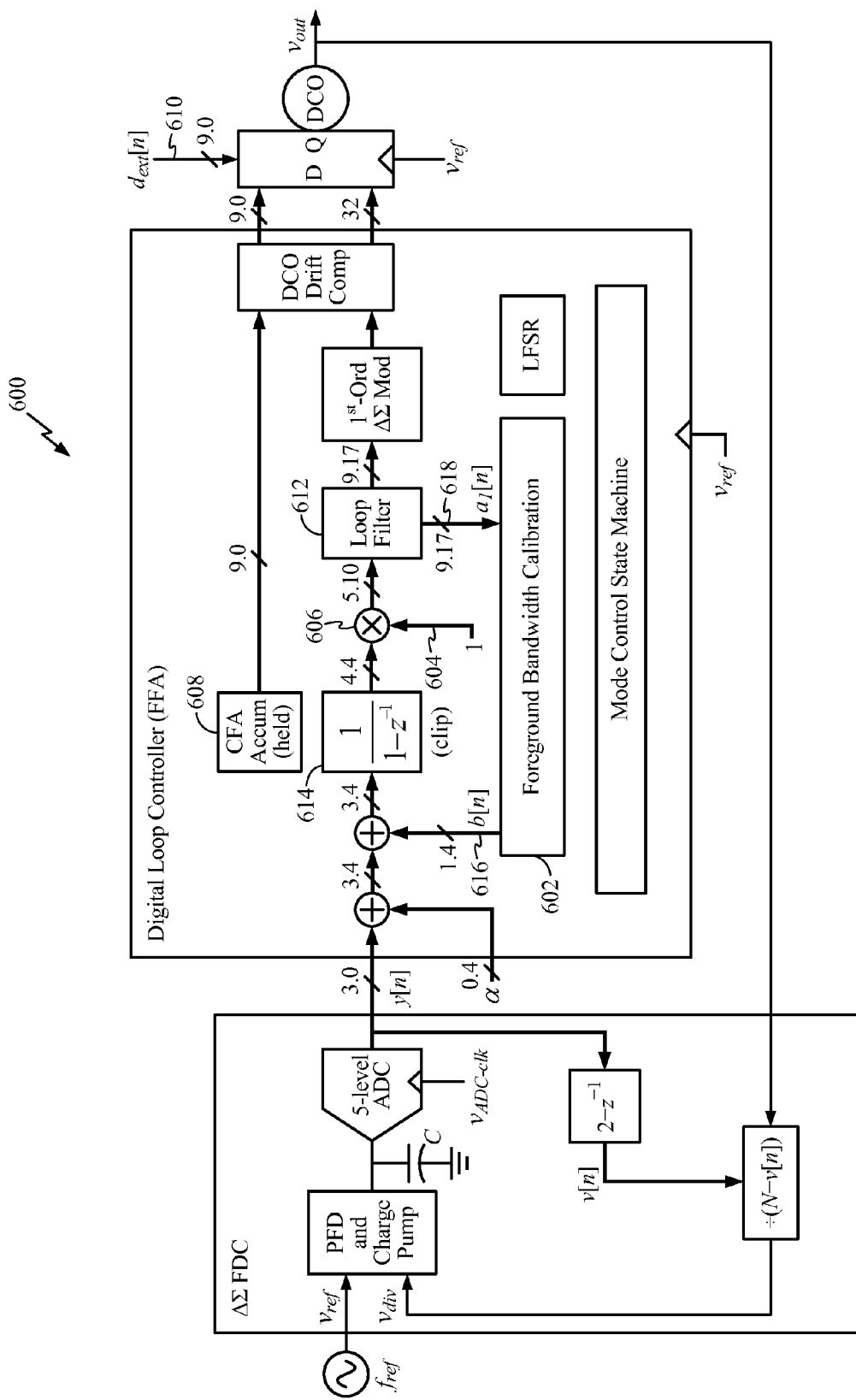
FIG. 6 illustrates an example block diagram of the FDC-PLL during fine frequency acquisition, in accordance with certain aspects of the present disclosure.

The FDC-PLL as configured during the FFA mode is illustrated in an example block diagram 600 in FIG. 6. It is the same configuration as in tracking mode (the example block diagram 200 in FIG. 2) except that the BBC block 214 is reset and not clocked, a foreground bandwidth calibration (FBC) block 602 is enabled, and an input 604 of $G_{BWC}$ multiplier 606 is set to unity. In an aspect of the present disclosure, a CFA accumulator 608 may not be clocked during the FFA mode so it is held at the value it had when the FFA mode was entered, and it is assumed that a value of external codeword 610, $d_{ext}[n]$ is not changed during the FFA mode. Optionally, the user can set the $K_P$ and $K_I$ values in the loop filter 612 (the loop filter 300 in FIG. 3) differently than in tracking mode to enable a wider loop bandwidth for faster settling. All the other components are the same as in tracking mode illustrated in FIG. 2.

Prior to initiating the FFA mode, the accumulator 614 preceding the loop filter 612 and that in the loop filter are both initialized to zero, and the sequence 616, b[n] is set to $$\begin{cases} -\alpha_{cal}, & \text{if } \alpha \geq 0 \\ \alpha_{cal}, & \text{if } \alpha < 0 \end{cases}, \quad (12)$$

where $\alpha_{cal}$ is selected to be 1/16, 1/8, 1/4, or 1/2 by the user via the input bit FBC_alpha_cal_sel.

Once initialized, the FDC-PLL is allowed to settle for a user-specified number, $P_{FFA}$, of reference periods (e.g., for $P_{FFA}$=350 reference periods which corresponds to 18.2 microseconds when $f_{ref}$=19.2 MHz). At that time, the output value 618 of integral path of the loop filter, $a_I[n_0]$ (the value 306 of the loop filter 300 from FIG. 3), is saved, where $n_0$ is the index of the $P_{FFA}^{th}$ reference period after the FDC-PLL enters the FFA mode.

Then, b[n] is set to zero and the FDC-PLL is allowed to settle again for $P_{FFA}$ reference periods. At that point, the FFA mode is terminated and tracking mode is entered with the initial value of $G_{BWC}$ set to $$G_{BWC} = \begin{cases} 16(a_I[n_0+P_{FFA}]-a_I[n_0])/\alpha_{cal}, & \text{if } \alpha \geq 0 \\ -16(a_I[n_0+P_{FFA}]-a_I[n_0])/\alpha_{cal}, & \text{if } \alpha < 0 \end{cases}. \quad (13)$$

The reasoning behind equation (13) is as follows. The analysis implies that the proportional path output 306 from the loop filter 300 illustrated in FIG. 3 has an average value of zero once the FDC-PLL has settled, so the output of the integral path of the loop filter, $a_I[n]$, sets the average value of the DCO's fine frequency control word, $d_{fine}[n]$. Therefore, $|a_I[n_0+P_{FFA}]-a_I[n_0]|$ is a measurement of $\alpha_{cal}/f_{ref}/K_{DCO}$. Given that $K_{DCO-ideal}$=1.2 MHz, which is $f_{ref}/16$, this implies that equation (13) is an estimate of $K_{DCO-ideal}/K_{DCO}$, which is the required value of $G_{BWC}$.

The choice of $\alpha_{cal}$ represents a tradeoff between immunity to noise and susceptibility to DCO control element mismatches. The larger the value of $\alpha_{cal}$, the higher the signal-to-noise ratio (SNR) in the estimate of $G_{BWC}$. However, the larger the value of $\alpha_{cal}$, the greater the likelihood of a DCO drift compensator adjustment during the measurement. Mismatches between the coarse and fine DCO control elements can cause a frequency glitch after such adjustments. Any such glitch that occurs late enough during the first $P_{FFA}$ reference periods that the resulting disturbance transient does not have time to die out, or during the second $P_{FFA}$ reference periods will cause error in the measurement of $G_{BWC}$. With the expected levels of DCO noise and mismatches, simulations indicate that the foreground bandwidth calibration algorithm corrects the FDC-PLL's loop bandwidth to within about ±10% of its ideal value with $\alpha_{cal}$=1/2.

For certain aspects of the present disclosure, fine frequency acquisition occurs in two steps. First, the FDC-PLL may be tuned to slightly less than a desired frequency. Then, the FDC-PLL may be tuned to the desired frequency. The difference between the accumulator in the proportional-integral loop filter at the end of these two steps may be a measure of the loop gain. The foreground bandwidth calibration unit may utilize this difference to calculate the initial value of $G_{BWC}$.

Figure 7:
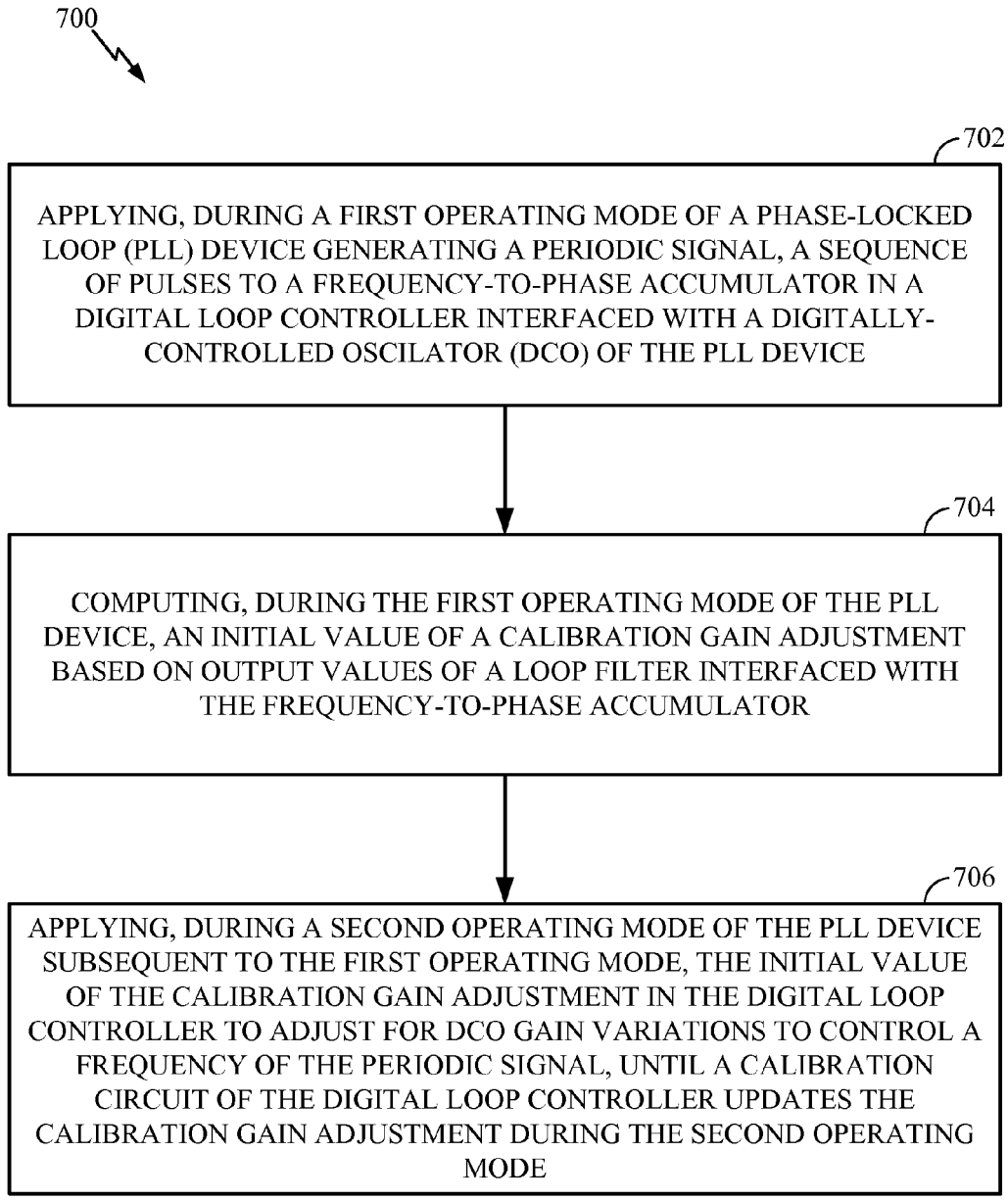
FIG. 7 illustrates a flow diagram of example operations for performing calibration in the FDC-PLL device for controlling a clock frequency generated by the FDC-PLL device, in accordance with certain aspects of the present disclosure.
Figure 7A:
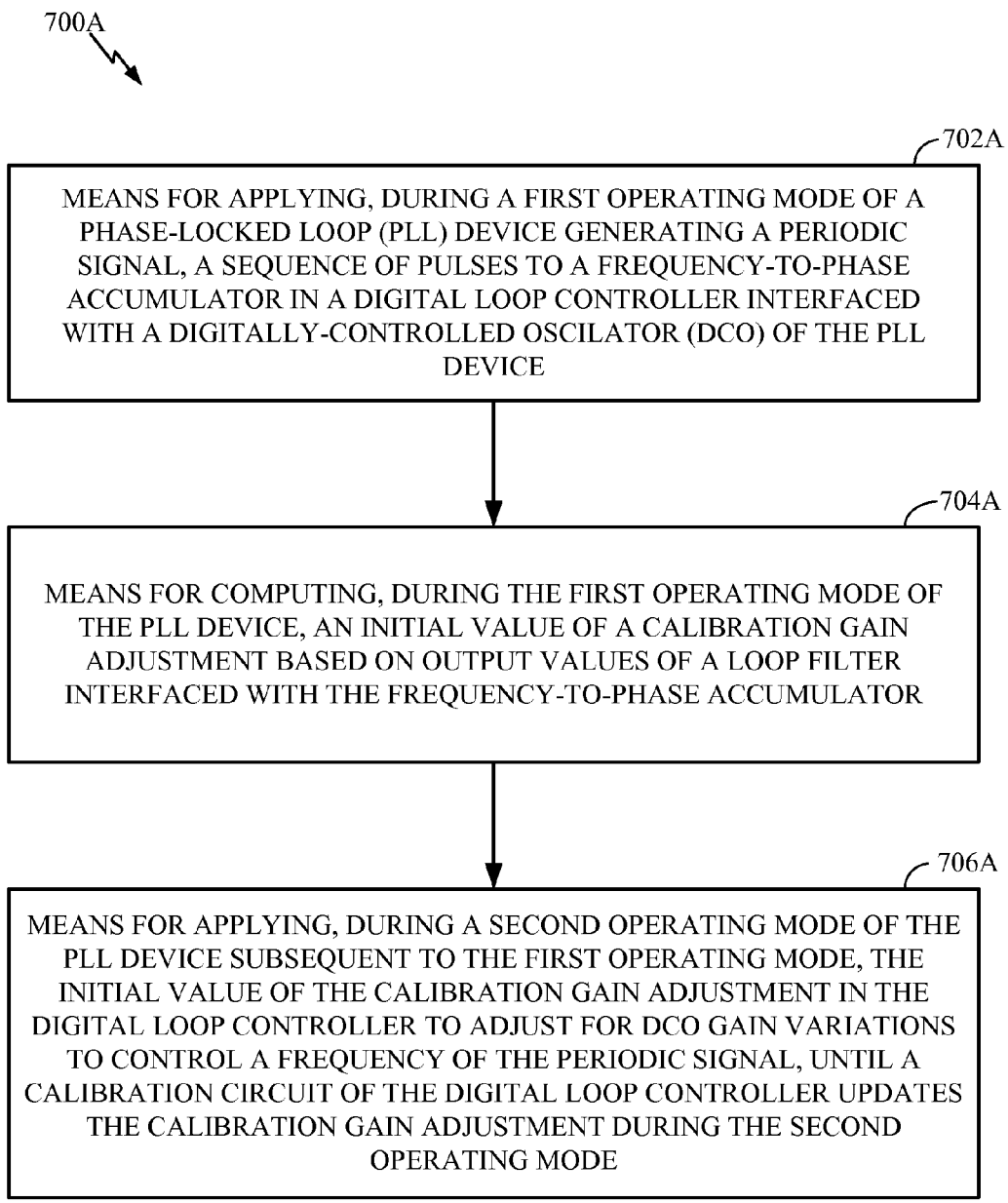
FIG. 7A illustrates example means capable of performing the operations shown in FIG. 7.

FIG. 7 is a flow diagram of example operations 700 for performing (foreground bandwidth) loop gain calibration in a phase-locked loop (PLL) device for generating a periodic signal, in accordance with certain aspects of the present disclosure. The operations 700 may be performed in hardware, e.g., by one or more components of the example FDC-PLL 600 from FIG. 6 and one or more components of the example FDC-PLL 200 from FIG. 2, e.g., by the foreground bandwidth calibration block 602 from FIG. 6 (first calibration circuit) and by the background bandwidth calibration block 214 from FIG. 2 (second calibration circuit).

The operations 700 may begin, at 702, by applying (e.g., by the foreground bandwidth calibration block 602 or the first calibration circuit), during a first operating mode (e.g., fine frequency acquisition mode) of the PLL device, a sequence of pulses (e.g., b[n]) to a frequency-to-phase accumulator (e.g., the accumulator 614) in a digital loop controller interfaced with a digitally-controlled oscillator (DCO) of the PLL device. At 704, during the first operating mode of the PLL device, an initial value of a calibration gain adjustment (e.g., initial value of $_{GBWC}$) may be computed (e.g., by the foreground bandwidth calibration block 602 or the first calibration circuit) based on output values (e.g., output values 306 from FIG. 3, output values 618 from FIG. 6) of a loop filter (e.g., the loop filter 612) interfaced with the frequency-to-phase accumulator. At 706, during a second operating mode (e.g., tracking mode) of the PLL device subsequent to the first operating mode, the initial value of the calibration gain adjustment may be applied (e.g., by the background bandwidth calibration block 214 or the second calibration circuit) in the digital loop controller to adjust for DCO gain variations to control a frequency of the periodic signal, until a calibration circuit of the digital loop controller (e.g., the background bandwidth calibration block 214 or the second calibration circuit) updates the calibration gain adjustment during the second operating mode.

According to aspects of the present disclosure, during the first operating mode, the PLL device is configured to lock the frequency of the periodic signal to a frequency value that deviates from a target value by a predetermined amount. During the second operating mode, the PLL device is configured to lock the frequency of the periodic signal to the target value.

According to aspects of the present disclosure, the output values of the loop filter (e.g., the output values 306 from FIG. 3, the output values 618 from FIG. 6) may comprise a pair of output values of an accumulator path of the loop filter generated a defined number of reference periods apart (e.g., $P_{FFA}$ reference periods apart). In an aspect, pulses in the sequence of pulses may set to zero after applying non-zero pulses in the sequence of pulses, and a second output value following a first output value in the pair of output values may be generated in response to setting pulses in the sequence of pulses to zero. According to aspects of the present disclosure, as discussed above, the sequence of pulses (e.g., b[n]) may comprise pulses with an amplitude (e.g., $\alpha_{cal}$) chosen as a tradeoff between a signal-to-noise ratio in estimating the calibration gain adjustment and susceptibility to mismatches of control elements of the DCO.

Figure 8:
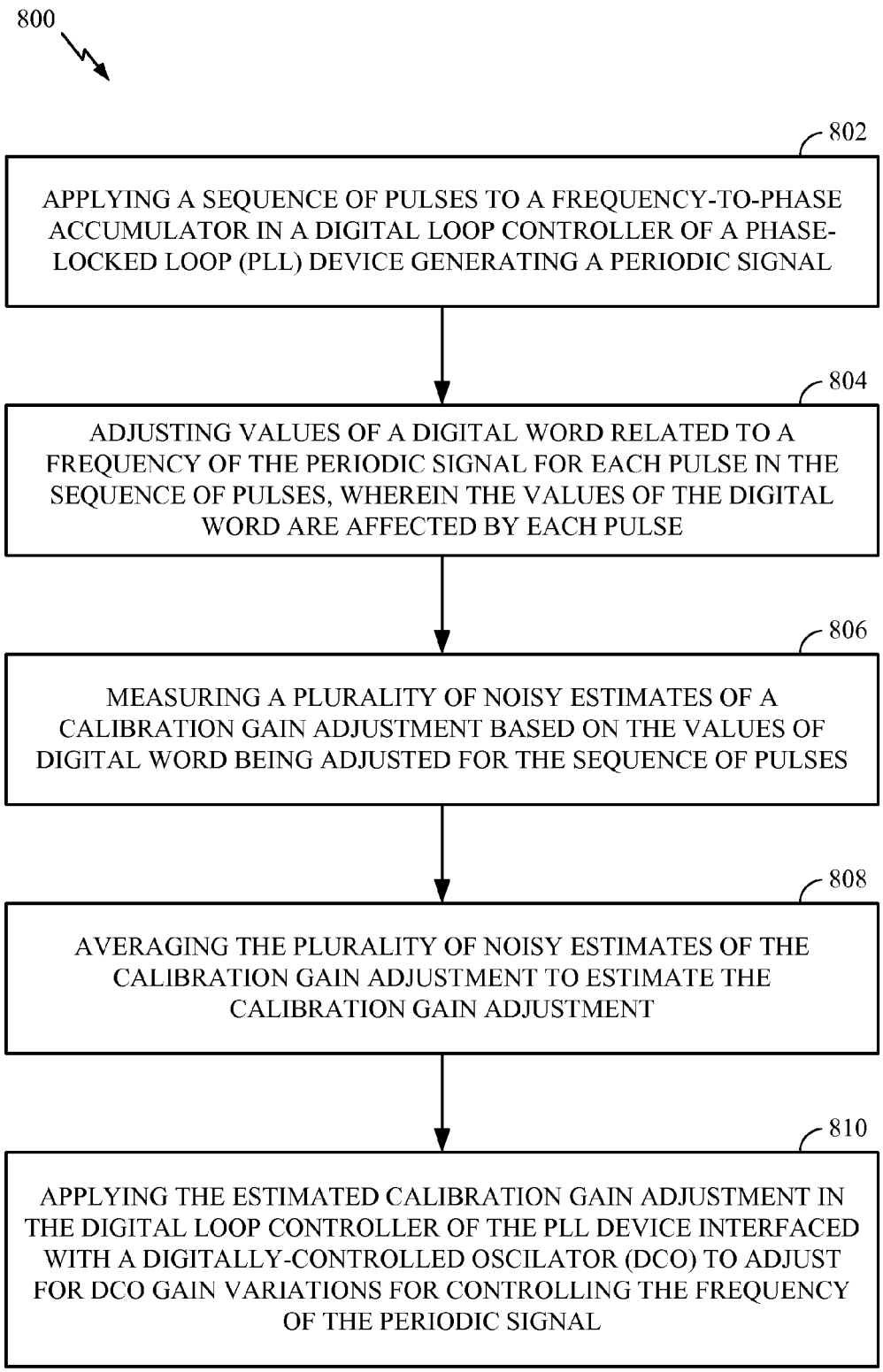
FIG. 8 illustrates a flow diagram of other example operations for performing calibration in the FDC-PLL device for controlling a clock frequency generated by the FDC-PLL device, in accordance with certain aspects of the present disclosure.
Figure 8A:
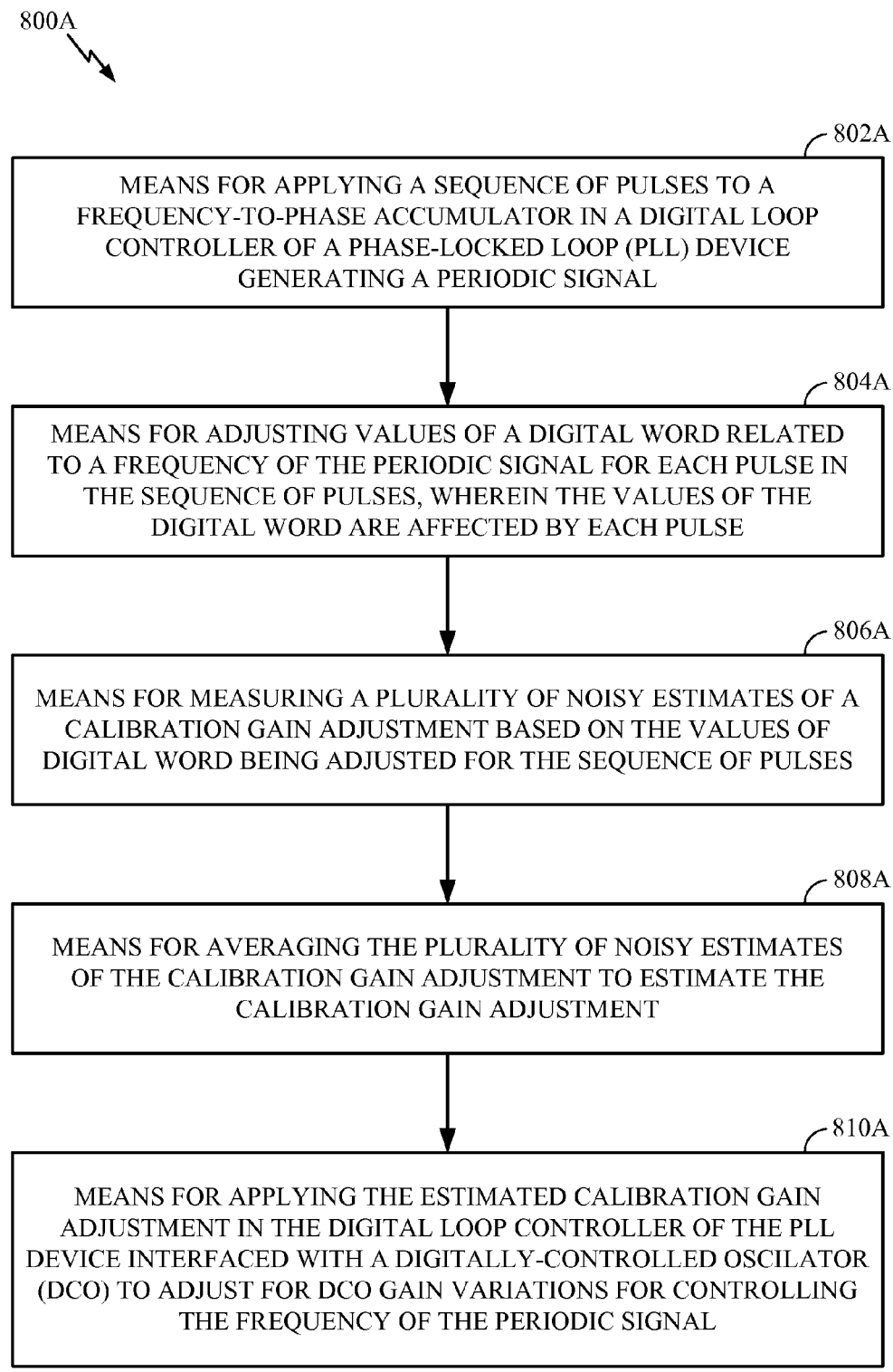
FIG. 8A illustrates example means capable of performing the operations shown in FIG. 8.

FIG. 8 is a flow diagram of example operations 800 for performing (background bandwidth) loop gain calibration in a phase-locked loop (PLL) device for generating a periodic signal, in accordance with certain aspects of the present disclosure. The operations 800 may be performed in hardware, e.g., by components of the example FDC-PLL 200 from FIG. 2, the loop filter 300 from FIG. 3, the bandwidth calibration block 400 from FIG. 4, and the generator 500 from FIG. 5.

The operations 800 may begin, at 802, by applying (e.g., by the background bandwidth calibration block 214 or a calibration circuit) a sequence of pulses (e.g., b[n]) to a frequency-to-phase accumulator (e.g., the accumulator 212) in a digital loop controller of the PLL device. At 804, values of a digital word related to a frequency of the periodic signal (e.g., $d_{fine}[n]$) may be adjusted (e.g., by circuitry comprising the proportional-integral loop filter 222 and digital delta-sigma modulator 218) for each pulse in the sequence of pulses, wherein the values of the digital word may be affected by each pulse. At 806, a plurality of noisy estimates of a calibration gain adjustment (e.g., noisy estimates of $G_{BWC}$) may be measured (e.g., by the background bandwidth calibration block 214 or the calibration circuit) based on the values of the digital word being adjusted for the sequence of pulses. At 808, the plurality of noisy estimates of the calibration gain adjustment may be averaged (e.g., by the background bandwidth calibration block 214 or the calibration circuit) to estimate the calibration gain adjustment. At 810, the estimated calibration gain adjustment may be applied (e.g., by the background bandwidth calibration block 214 or the calibration circuit) in the digital loop controller of the PLL device interfaced with a digitally-controlled oscillator (DCO) to adjust for DCO gain variations for controlling the frequency of the periodic signal.

According to aspects of the present disclosure, the sequence of pulses may comprise pulses with an amplitude (e.g., $\beta_{cal}$) represents a tradeoff between an error in estimating the calibration gain adjustment resulting from a combined effect of noise sources in the PLL device and an absolute jitter of the PLL device. According to aspects of the present disclosure, the sequence of pulses may comprises multiple concatenated pairs of pulses, wherein two pulses of each concatenated pair of pulses repeat randomly values of the pair or negative values of the pair each concatenating period, and two pulses in each concatenated pair of pulses have amplitudes of opposite signs with a same absolute value, e.g., as defined by equation (10).

According to aspects of the present disclosure, measuring (e.g., by the background bandwidth calibration block 214 or the calibration circuit) the plurality of noisy estimates of the calibration gain adjustment may comprise measuring, during each concatenating period and for each concatenated pair of pulses, a noisy estimate of the plurality of noisy estimates of the calibration gain adjustment based on the values of the digital word being adjusted for that concatenated pair of pulses. As discussed above, estimation of the calibration gain adjustment may be repeated every defined number of reference periods (e.g., every $2MP_{BBC}$ reference periods).

According to aspects of the present disclosure, prior to estimating the calibration gain adjustment in an operating mode of the PLL device, the calibration circuit is further configured to apply an initial value of the calibration gain adjustment in the digital loop controller of the PLL device to adjust for the DCO gain variations, wherein the initial value of the calibration gain adjustment was computed during another operating mode of the PLL device preceding the operating mode. As discussed above, in the other operating mode, the PLL device is configured to lock the frequency of the periodic signal to a frequency value that deviates from a target value by a predetermined amount. In the operating mode, the PLL device is configured to lock the frequency of the periodic signal to the target value.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, operations 700, 800 illustrated in FIGS. 7-8 correspond to means 700A, 800A illustrated in FIGS. 7A-8A.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for performing loop gain calibration in a phase-locked loop (PLL) device for generating a periodic signal, comprising:
    applying, during a first operating mode of the PLL device, a sequence of pulses to a frequency-to-phase accumulator in a digital loop controller interfaced with a digitally-controlled oscillator (DCO) of the PLL device;
    computing, during the first operating mode of the PLL device, an initial value of a calibration gain adjustment based on output values of a loop filter interfaced with the frequency-to-phase accumulator; and
    applying, during a second operating mode of the PLL device subsequent to the first operating mode, the initial value of the calibration gain adjustment in the digital loop controller to adjust for DCO gain variations to control a frequency of the periodic signal, until a calibration circuit of the digital loop controller updates the calibration gain adjustment during the second operating mode.

2. The method of claim 1, wherein:
    during the first operating mode, the PLL device is configured to lock the frequency of the periodic signal to a frequency value that deviates from a target value by a predetermined amount, and
    during the second operating mode, the PLL device is configured to lock the frequency of the periodic signal to the target value.

3. The method of claim 1, wherein the output values of the loop filter comprise a pair of output values of an accumulator path of the loop filter generated a defined number of reference periods apart.

4. The method of claim 3, wherein:
    pulses in the sequence of pulses are set to zero after applying non-zero pulses in the sequence of pulses, and
    a second output value following a first output value in the pair of output values is generated in response to setting pulses in the sequence of pulses to zero.

5. The method of claim 1, wherein the sequence of pulses comprises pulses with an amplitude chosen as a tradeoff between a signal-to-noise ratio in estimating the calibration gain adjustment and susceptibility to mismatches of control elements of the DCO.

6. An apparatus for performing loop gain calibration in a phase-locked loop (PLL) device for generating a periodic signal, comprising:
    a first calibration circuit configured to apply, during a first operating mode of the PLL device, a sequence of pulses to a frequency-to-phase accumulator in a digital loop controller interfaced with a digitally-controlled oscillator (DCO) of the PLL device, wherein
    the first calibration circuit is further configured to compute, during the first operating mode of the PLL device, an initial value of a calibration gain adjustment based on output values of a loop filter interfaced with the frequency-to-phase accumulator; and a second calibration circuit of the digital loop controller configured to apply, during a second operating mode of the PLL device subsequent to the first operating mode, the initial value of the calibration gain adjustment in the digital loop controller to adjust for DCO gain variations to control a frequency of the periodic signal, until the second calibration circuit updates the calibration gain adjustment during the second operating mode.

7. The apparatus of claim 6, wherein:
during the first operating mode, the PLL device is configured to lock the frequency of the periodic signal to a frequency value that deviates from a target value by a predetermined amount, and
during the second operating mode, the PLL device is configured to lock the frequency of the periodic signal to the target value.

8. The apparatus of claim 6, wherein the output values of the loop filter comprise a pair of output values of an accumulator path of the loop filter generated a defined number of reference periods apart.

9. The apparatus of claim 8, wherein:
pulses in the sequence of pulses are set to zero after applying non-zero pulses in the sequence of pulses, and
a second output value following a first output value in the pair of output values is generated in response to setting pulses in the sequence of pulses to zero.

10. The apparatus of claim 6, wherein the sequence of pulses comprises pulses with an amplitude chosen as a tradeoff between a signal-to-noise ratio in estimating the calibration gain adjustment and susceptibility to mismatches of control elements of the DCO.

* * * * *